United States Patent
Pogge et al.

(10) Patent No.: US 6,460,265 B2
(45) Date of Patent: *Oct. 8, 2002

(54) DOUBLE-SIDED WAFER EXPOSURE METHOD AND DEVICE

(75) Inventors: H. Bernhard Pogge, Hopewell Junction, NY (US); Christopher P. Ausschnitt, Brookfield, CT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,720

(22) Filed: Nov. 12, 1998

(65) Prior Publication Data

US 2001/0001900 A1 May 31, 2001

(51) Int. Cl.⁷ .................................................. G01B 3/14
(52) U.S. Cl. ............................... 33/562; 33/553; 33/566
(58) Field of Search ....................... 33/553, 562, 563, 33/566, 645, 613, 24.3; 414/936, 935

(56) References Cited

U.S. PATENT DOCUMENTS

| 689,354 | A | * | 12/1901 | Colton | 33/562 |
| 753,005 | A | * | 2/1904 | Schantz | 33/24.3 |
| 1,811,121 | A | * | 6/1931 | Gastell | 33/24.3 |
| 3,417,472 | A | * | 12/1968 | Nelson | 33/24.3 |
| 5,548,372 | A | | 8/1996 | Schroeder et al. | |
| 5,604,354 | A | | 2/1997 | Lauverjat | |
| 5,627,378 | A | | 5/1997 | Baxter | |
| 5,983,477 | A | * | 11/1999 | Jacks et al. | 29/407.1 |

FOREIGN PATENT DOCUMENTS

| DE | 307475 | * | 8/1918 | 33/24.3 |
| GB | 2045691 | * | 11/1980 | 33/24.3 |
| IT | 0269764 | * | 12/1929 | 33/24.3 |

* cited by examiner

*Primary Examiner*—Diego Gutierrez
*Assistant Examiner*—Lydia M. DeJesús
(74) *Attorney, Agent, or Firm*—Connolly Bove Lodge & Hutz; Joseph P. Abate, Esq.

(57) ABSTRACT

A device for creating at least one aligned marking on opposite sides of a semiconductor wafer including a front side and a back side. A wafer receiving support unit including at least a first wafer receiving slot in a first side wall thereof receives a wafer inserted therein. A template positions at least one aligned marking on each of the front side of the semiconductor wafer and on the backside of the semiconductor wafer.

10 Claims, 4 Drawing Sheets

FIG. 1
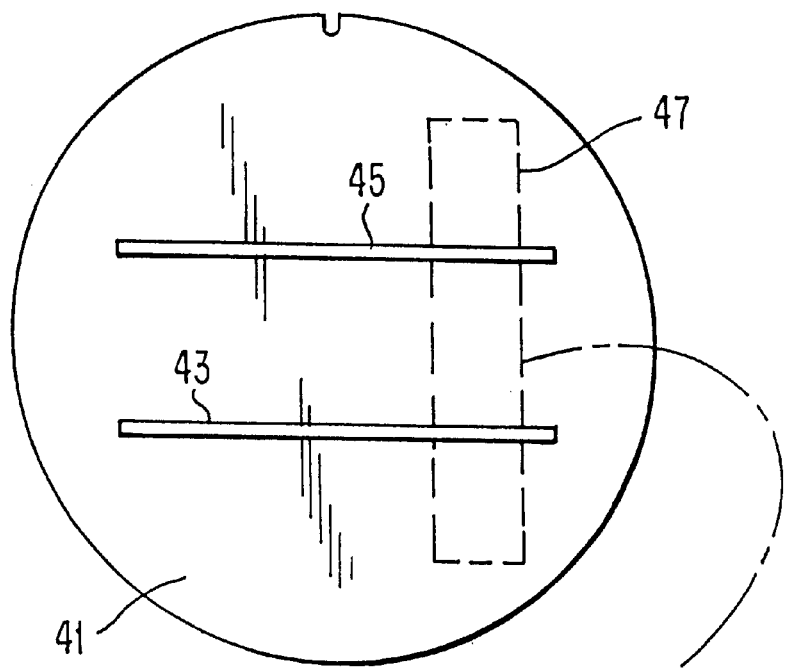
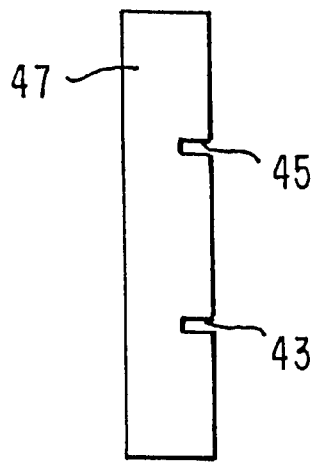
FIG. 2(a)
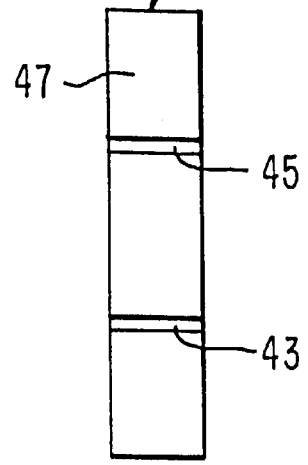
FIG. 2(b)

DOUBLE-SIDED WAFER EXPOSURE METHOD AND DEVICE

FIELD OF THE INVENTION

The invention relates to methods for exposing both sides of a semiconductor wafer such that the exposure patterns on both sides of the wafer may be aligned. The present invention also relates to devices for forming aligned markings on a semiconductor wafer as well as methods for making the device.

BACKGROUND OF THE INVENTION

To accommodate more features on a single chip, future chip technologies may require multi-functional chip macros on a single chip. Such requirements often tend to create larger chips, which may in turn suffer from chip yield and optimal performance problems. One method for addressing these problems is the "precision aligned macro" concept discussed in U.S. Pat. Nos. 5,770,884 and 5,814,885, the entire contents of the disclosures of which are hereby incorporated by reference.

However, the precision aligned macro concept typically requires aligned top surface and backside exposure patterns. Producing aligned patterns on both sides of a wafer may require a double-sided exposure of the wafer to realize the alignment of patterns on the front with those on the back sides of the wafer.

Although exposure tools exist to create such aligned patterns on the front and back side of the wafer, they are not readily available in production lines. As a result, such exposure tools need to be off the production line and require wafers to be moved off line for processing. Additionally, the tools may be very expensive.

According to one example, a method for creating aligned exposure patterns on the front and backside of a wafer requires a double-sided exposure or an infrared transmission exposure lithography tool. Both of these types of tools can be expensive. Additionally, these tools are not readily available in the production line.

Another method currently utilized to expose both sides of a semiconductor wafer includes pairing masks or flipping two masks and wafer combinations to expose the back of wafers. According to this method, two different photolithography masks are provided. The two masks are arranged opposite each other in an exposure device and then aligned. The wafer is then inserted between the masks. One side of the wafer is exposed. Then, the radiation source utilized in the exposure tool or, alternatively, a mirror system, are fliped to direct the radiation through the other mask to expose the other side of the wafer.

SUMMARY OF THE INVENTION

The present invention solves these and other problems by providing a simple method and apparatus that may utilize conventional exposure tools. Accordingly, aspects of the present invention provide a device for creating at least one aligned marking on opposite sides of a semiconductor wafer including a front side and backside. The device includes a wafer receiving support unit including at least a first wafer receiving slot and a first sidewall thereof for receiving a semiconductor wafer inserted therein. The device also includes a template for positioning at least one aligned marking on each of the front side of the semiconductor wafer and the backside of the semiconductor wafer.

Additional aspects of the present invention provide a method for forming a device for creating aligned markings on opposite sides of a semiconductor wafer including a front side and a backside. The method includes providing a semiconductor wafer receiving support unit having a top wall, a bottom wall, and four side walls. At least one wafer receiving slot is provided and at least one of the side walls of the support unit. A template is provided on the support unit for positioning aligned markings on the front side of the semiconductor wafer and the backside of the semiconductor wafer.

Further aspects of the present invention provide a method for forming aligned markings on opposite sides of a semiconductor wafer including a front side and a backside. The method includes providing a wafer receiving support unit including a top wall, a bottom wall, four side walls, at least one wafer receiving slot and at least one of the side walls, the template for positioning aligned markings on the front side of the semiconductor wafer and on the backside of the semiconductor wafer. A semiconductor wafer is inserted into the at least one wafer receiving slot. The semiconductor wafer is then exposed utilizing the template to create aligned markings on the front side and the backside of the semiconductor wafer.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 1 represents a top plan view of a semiconductor wafer with an embodiment of a device for creating at least one aligned marking on opposite sides of a semiconductor wafer according to the present invention that may be formed from;

FIG. 2a represents a side view of an embodiment of a device according to the present invention;

FIG. 2b represents a top view of the embodiment of the device illustrated in FIG. 2a;

DETAILED DESCRIPTION OF THE INVENTION

Figure 3:
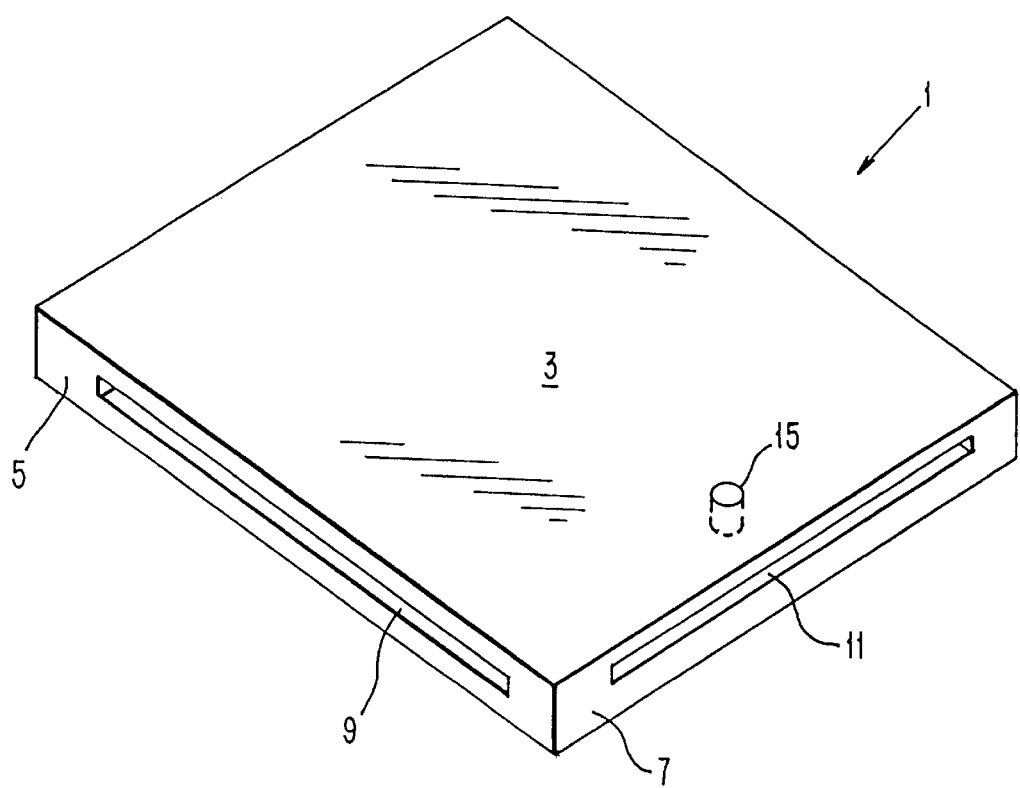
FIG. 3 represents a perspective view of an embodiment of a wafer receiving support unit according to the present invention.

As stated above, the present invention provides a method and apparatus for creating aligned markings on opposite sides of a semiconductor wafer. By providing such a method and apparatus, the present invention permits precisely aligned structures to be created on opposite sides of a single semiconductor wafer.

Significantly, the present invention may utilize existing exposure tools typically present in existing production lines. Accordingly, the present invention does not require any additional tools with the exception of the simple device for creating aligned markings on opposite sides of a semiconductor wafer. As a result, the present invention may provide a simple and inexpensive method and apparatus for forming such aligned markings on opposite sides of a semiconductor wafer. Since the present invention may utilize existing exposure tools, the present invention does not require any disruption of a normal wafer flow in a production line, such as removing the wafers from the production line to carry them to a separate tool. By providing aligned markings on opposite sides of a semiconductor wafer, the present invention may then permit aligned structures to be formed on opposite sides of a semiconductor wafer.

A device according to the present invention for creating at least one aligned marking on a front side and a backside of a semiconductor wafer includes a wafer-receiving supporting unit. The wafer-receiving supporting unit includes at least one structure for supporting at least a portion of a semiconductor wafer. The device also includes a template for positioning at least one aligned marking on each of the front side of the semiconductor wafer and the back side of the semiconductor wafer.

The wafer-receiving supporting unit may include a top wall and a bottom wall that will be adjacent at least a portion of both of a top side and back side of a semiconductor wafer when the device is in use. It is not necessary that the top and bottom walls cover the entire surface of the wafer when in use. In fact, the "walls" may only cover a small portion of the semiconductor wafers. Along these lines, although the wafer-receiving supporting unit is described as having a top wall, it may be that the top wall only covers a small portion of a semiconductor wafer arranged in the wafer-receiving supporting unit so as to permit aligned markings to be formed on the front side of the wafer and the back side of the wafer.

The wafer-receiving supporting unit also includes at least one side wall. The at least one side wall may extend along a portion of the bottom wall and/or top wall of the wafer-receiving supporting unit. Typically, a semiconductor wafer arranged in the wafer-receiving supporting unit will be adjacent at least a portion of the at least one side wall.

According to some embodiments, the wafer-receiving supporting unit includes four side walls. Regardless of the number of the sidewalls that the wafer-receiving supporting unit includes, it is not necessary that the sidewalls extend entirely along the length of a side of the bottom wall and/or top wall of the wafer-receiving supporting unit. In fact, typically, at least one of the sidewalls includes a wafer-receiving slot therein.

However, depending upon the number of sidewalls present in the wafer-receiving supporting unit as well as the structure of the template, among other aspects of the present invention, it is not necessary that any of the sidewalls include a wafer-receiving slot therein. Along these lines, one side of wafer-receiving supporting unit may not include a sidewall. This absence of a sidewall may act as a wafer-receiving supporting slot in the wafer-receiving supporting unit.

FIG. 3 shows an example of an embodiment of a wafer-receiving supporting unit 1. The embodiment illustrated in FIG. 3 includes a top wall 3 and a bottom wall (not shown in FIG. 3). The wafer-receiving supporting unit 1 illustrated in FIG. 3 also includes sidewalls on all four sides of the wafer-receiving supporting unit but only two sidewalls 5 and 7 are visible in the perspective view illustrated in FIG. 3. Each of the sidewalls 5 and 7 illustrated in FIG. 3 includes a wafer-receiving slot 9 and 11 for receiving at least a portion of a semiconductor wafer.

It is not necessary that the wafer-receiving slots be wide enough to receive the entire width or diameter of a semiconductor wafer. In some cases, it may be desirable that the wafer-receiving slot only be able to accommodate a portion of the width or diameter of the semiconductor wafer. According to such an embodiment, the portions of the sidewall defining the sides of the wafer-receiving slot may help to position the semiconductor wafer in the wafer-receiving supporting unit. Of course, if it is desired that the wafer-receiving supporting unit receive more than half of the semiconductor wafer therein, then typically at least one of the wafer-receiving slots will be wide enough to accommodate the entire width of the semiconductor wafer. Alternatively, the wafer-receiving supporting unit may not include a sidewall along one side to permit the entire semiconductor wafer to be inserted therein.

According to one embodiment, the wafer receiving supporting unit may be designed such that a wafer may be inserted starting from a corner. For example, in the embodiment of the present invention illustrated in FIG. 6, a wafer would be inserted into the wafer receiving supporting unit starting in the corner adjacent the wafer support 13, discussed below in greater detail. When the wafer is fully inserted, its sides would extend out of the wafer receiving supporting unit that intersect to form the corner where the wafer is inserted. Such an embodiment might not include any walls on the sides that the wafer is inserted or could include a slot that extends about one-half of the way about the wafer receiving supporting unit.

To facilitate the supporting of a semiconductor wafer by the wafer-receiving supporting unit, the wafer-receiving supporting unit may include structure in addition to the wafer-receiving slot or slots.

Typically, supporting structure is provided to facilitate the supporting of the semiconductor wafer placed in the wafer-receiving supporting unit. Along these lines, typically, the supporting structure is provided such that the at least one semiconductor wafer will be immobilized, such that at least it will not rock back and forth, when the wafer is arranged in the wafer-receiving supporting unit.

Along these lines, if it is imagined that the semiconductor wafer includes two halves and one half of the wafer is supported by the wafer-receiving slots, then the other half of the wafer could be at least partially supported by the wafer supporting structure. Some embodiments of the wafer-receiving supporting unit according to the present invention may include a plurality of wafer supporting structures. According to such embodiments, the wafer-receiving slots may not provide any support to the semiconductor wafer when it is arranged in the wafer-receiving supporting unit.

Figure 6:
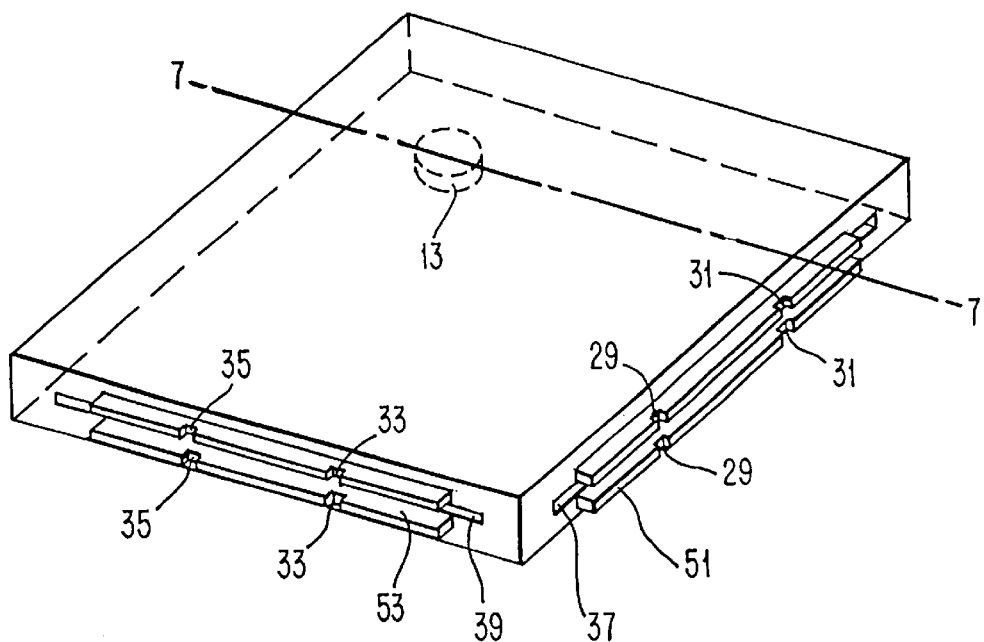
FIG. 6 represents a perspective view of another embodiment of a device for creating at least one aligned marking on opposite sides of the semiconductor wafer according to the present invention.
Figure 7:
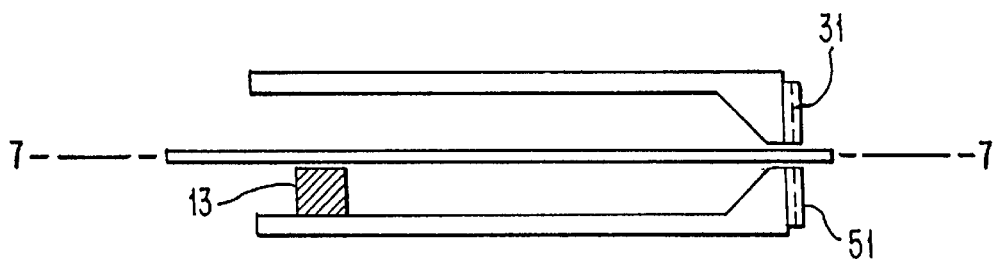
FIG. 7 represents a cross-sectional view of the embodiment of the present invention illustrated in FIG. 6 taken along the line 7—7.

The embodiment of the present invention shown in FIGS. 6 and 7 illustrates one embodiment of a wafer supporting structure that may be included in the wafer-receiving supporting unit. The embodiment depicted in FIGS. 6 and 7 includes at least one semiconductor wafer support 13 provided on the bottom wall of the wafer-receiving supporting unit. If the wafer-receiving supporting unit includes at least one wafer support, the at least one wafer support may be placed anywhere on the bottom wall of the wafer-receiving supporting unit.

As stated above, the wafer-receiving supporting unit according to the present invention typically includes at least one wafer-receiving slot. However, the wafer-receiving supporting unit may include any number of wafer-receiving slots. For example, a wafer-receiving supporting unit that includes four sidewalls may include a wafer-receiving slot formed in each sidewall. According to this embodiment, the wafer-receiving slots may have a width such that they can receive at least a portion of a semiconductor wafer therein.

Typically, at least one of the wafer-receiving slots is sufficiently wide to accommodate the entire width of the semiconductor wafer therein. However, as stated above, if the wafer-receiving supporting unit simply does not include a sidewall, then no wafer-receiving slot can be provided therein. According to such an embodiment, the lack of a sidewall may be considered to be a wafer-receiving slot that is as large as the space defined by two adjacent side edges of the top wall and the bottom wall of the wafer-receiving supporting unit.

As stated above, it may be desired that at least one of the at least one wafer-receiving supporting slots have a width that will only accommodate a portion of the width of the semiconductor wafer arranged in the wafer-receiving supporting unit. In fact, two of the wafer-receiving slots may have a width such that they can only partially accommodate the width of the semiconductor wafer therein. The engaging by a semiconductor wafer of the sidewalls of the wafer-receiving supporting unit adjacent to such slots may facilitate the immobilization and positioning of a semiconductor wafer arranged in the wafer-receiving, supporting unit.

As stated above, a device according to the present invention also includes a template for facilitating the positioning at least one aligned marking on each of the front side of a semiconductor wafer and the back side of semiconductor wafer. The template may take a variety of forms. In some embodiments, the template includes at least one member attached to the wafer receiving supporting unit. According to other embodiments, the template is formed in and/or on the wafer receiving supporting unit.

According to one embodiment, the template includes at least one passage formed in the top wall and the bottom wall of the wafer-receiving supporting unit 15 as illustrated in FIG. 3. According to such an embodiment, the template could be formed by simply drilling at least one hole straight both through the top wall and bottom wall of the wafer-receiving supporting unit. More than one hole may be drilled through the wafer-receiving supporting unit if desired to create aligned markings on more than one location of each side of the semiconductor wafer placed therein.

In the event that the template includes at least one hole in the top wall or in the bottom wall of the wafer-receiving supporting unit, the at least one hole could be drilled in the top wall and bottom wall of the wafer-receiving supporting unit. Along these lines, any device such as a drill press could be utilized to ensure that the drill bit passes through the wafer-receiving supporting unit perpendicular to the top wall and bottom wall of the wafer-receiving supporting unit. As stated above, multiple passages may be provided in the top wall and bottom wall of the wafer-receiving supporting unit. In such cases, multiple holes may be drilled through the top wall and bottom wall of the wafer-receiving supporting unit in similar manner.

According to other embodiments, the template may include at least one template slot provided on the wafer supporting unit such that the at least one template slot will be in the vicinity of opposite sides of the opening of at least one of the wafer-receiving slots on the wafer supporting unit. The at least one template slot may be provided on the wafer-receiving supporting unit or on a separate structure attached to the wafer-receiving supporting unit. The at least one template slot typically is provided at the edge of the wafer receiving supporting unit, such that the wafer receiving supporting unit and/or structure attached thereto and including the at least one template slot acts as a mask during exposure of the semiconductor wafer inserted into the wafer receiving supporting unit.

According to one embodiment, the edge of the wafer-receiving supporting unit could be cut to provide a slot in one of the sidewalls of the wafer-receiving supporting unit. According to such an embodiment, a straight-line cut could simply be made in the sidewall of the wafer-receiving supporting unit.

According to other embodiments, the at least one template slot is provided on a separate structure attached to the wafer supporting unit. According to one embodiment, at least one template slot may be provided in the vicinity of at least two of the slots in the sidewalls of the wafer-receiving supporting unit. According to such an embodiment, the at least one template slot may be formed in the wafer supporting unit or provided on a separate structure attached to the wafer supporting unit. In fact, the present invention may include at least one template slot on the wafer supporting unit in the vicinity of all of the wafer-receiving slots provided therein.

Figure 5:
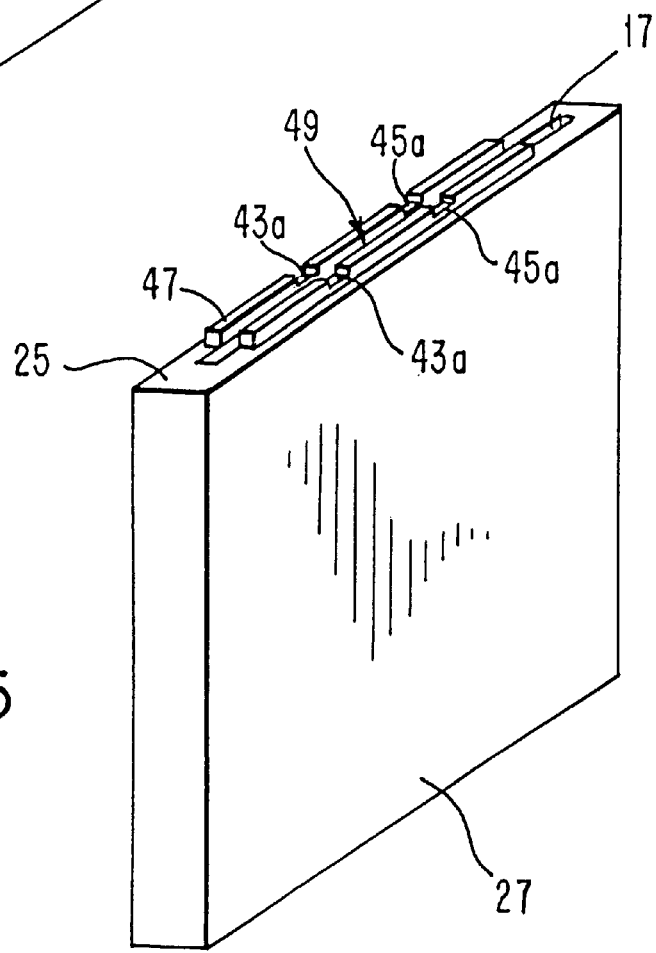
FIG. 5 represents a perspective view of the embodiment of the wafer receiving support unit illustrated in FIG. 4 wherein the template has been completely formed.

FIG. 5 illustrates an embodiment of a wafer-receiving supporting unit according to the present invention that includes a wafer-receiving slot 17. Two pairs of template slots 43a and 45a are provided on a structure 23 attached to the sidewall 25 of the wafer-receiving supporting unit 27 in the vicinity of the slot 17 provided in the sidewall 25. As can be seen in the embodiment shown in FIG. 5, the template may include two pairs of template slots 43a and 45a.

According to one embodiment, the at least one template slot is provided on a corresponding location on the wafer-receiving supporting unit. Such a template may be utilized to form similar markings on similar locations on the front side and back side of a semiconductor wafer.

The template may include only one template slot for forming one marking on opposite sides of a semiconductor wafer. The template slots may be provided at any location on the wafer-receiving supporting unit. In fact, the at least one template slot for forming a marking on each side of a semiconductor wafer may be provided in different locations to form markings on different locations on a semiconductor wafer. However, the relative positions of the markings on each side of the semiconductor wafer typically should be known if the template slots are not arranged in the same location so as to permit aligned structures to be formed on opposite sides of the semiconductor wafer.

The template slots may have any desired cross section. The template slots illustrated in FIGS. 5 and 6 are generally rectangular. However, any desired template slot cross section may be utilized.

In accordance with the above, regarding the number, arrangement, and shape of the template and template slots, the embodiment illustrated in FIG. 6 includes four pairs of template slots, two pairs arranged adjacent to different semiconductor wafer-receiving slots provided in the wafer-receiving supporting unit. In the embodiment illustrated in FIG. 6, each pair of template slots 29, 31, 33 and 35 is arranged in corresponding locations of opposite sides of the wafer-receiving slots 37 and 39.

The wafer-receiving supporting unit and template may be formed in a variety of ways. For example, the top and bottom walls and sidewalls of the wafer-receiving supporting unit may be formed separately and then assembled together. Alternatively, the wafer-receiving supporting unit could be formed of a single unitary piece of material.

The wafer receiving supporting unit may also be made of a variety of materials. For example, the wafer receiving supporting unit could be made of metal, plastic, ceramic, and/or composite materials. The material that the semiconductor wafer receiving unit is made of at least partially dictates how it is formed.

If the wafer-receiving supporting unit is made of metal, the metal could be cast in the desired shape. If the wafer-receiving supporting unit is plastic, the unit could be injection molded. Alternatively, a single solid piece of metal or plastic could be utilized to form the wafer-receiving supporting unit. The interior of the single piece of material could than be cut out as decided.

After creating the wafer-receiving supporting unit with the desired number and configuration of wafer-receiving slots therein, the template may be provided for positioning the aligned markings on the front side and back side of the semiconductor wafer. In the event that the template includes at least one hole in the top wall or in the bottom wall of the wafer-receiving supporting unit, the at least one hole could be drilled as described above. In the event that template slots such as 29, 31, 33 and 35 as in the embodiment illustrated in FIG. 6 are included in the present invention, such slots may be formed by cutting the side wall(s) of the wafer-receiving supporting unit.

According to another embodiment, the templates may be fabricated as follows. First, a standard semiconductor wafer such as that illustrated in FIG. 1 may be etched according to standard photolithograhic processes. According to such a process, typically a pair of grooves 43 and 45 are etched in the top of the wafer 41. The grooves 43 and 45 can have lengths as long as the wafer that they are formed in, widths of about 0.1 $\mu$m to about 10 $\mu$m, typically about 0.5 $\mu$m to about 2.0 $\mu$m, and depths of about 0.1 $\mu$m to about 10 $\mu$m, typically about 0.5 $\mu$m to about 2.0 $\mu$m.

After forming the grooves in the wafer 41, a section 47 of wafer 41 may be removed from the wafer. The dimensions of the section 47 removed from the wafer 41 may depend upon the size of the wafer-receiving supporting unit as well as the size of the wafer to be treated in the wafer-receiving supporting unit. The wafer 41 may be considered to be a template blank. Alternatively, only the portion 47 may be considered to be the template blank. Regardless of whether the wafer 41 or the portion 47 is considered the template blank, the grooves 43 and 45 actually represent the template pattern. FIG. 2a provides a side view of the template portion 47. FIG. 2b represents a top view of the template blank portion 47.

Figure 4:
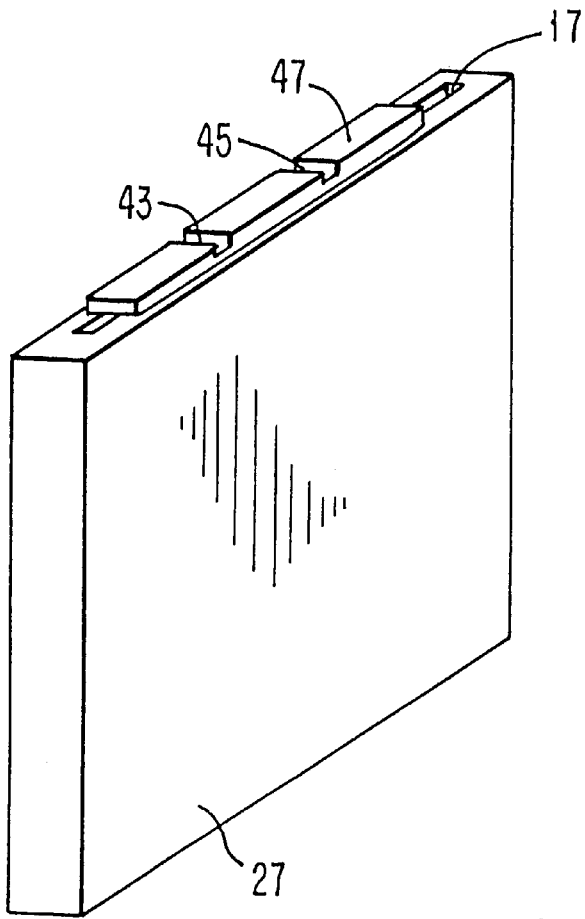
FIG. 4 represents a perspective view of an embodiment of a wafer receiving support unit according to the present invention wherein one embodiment of a template is being provided on the wafer receiving support unit.

After forming a template blank portion 47, the template blank may be mounted on the semiconductor wafer-receiving supporting unit 27 as illustrated in FIG. 4. For example, the blank 47 can be adhered to the surface of unit 27, with glue, epoxy, or any other adhesive.

After attaching the template 47, which includes the pattern of template slots 43 and 45 on the wafer-receiving supporting unit 27 in a location over one of the wafer-receiving slots 17 in the embodiment illustrated in FIG. 4 such that a semiconductor wafer arranged in the slot will have the markings formed in the desired location on the wafer, a slot 49 is cut in the template 47. This dicing slot 49 may be formed mechanically, such as with some sort of saw or with a laser. Cutting the slot 49 in the template will create two sections that are exactly aligned with each other, such as slot pairs 43a and 45a.

As illustrated in FIG. 6, a template 51 and 53 may be attached to each of two slots 37 and 39 in a wafer-receiving supporting unit according to the present invention. However, as is apparent from the above, a template may be attached to the semiconductor wafer receiving unit at any or every wafer receiving slot.

FIG. 7 provides a cross-sectional view of a wafer-receiving supporting unit including the template 51. Broken lines in the template 51 indicate one of the template slots 29 and 31.

The present invention also includes a method of forming aligned markings on opposite sides of semiconductor wafer including a front side and a back side. According to the method, the wafer-receiving supporting unit is provided. The wafer-receiving supporting unit includes a top wall, a bottom wall, four sidewalls, at least one wafer-receiving slot and at least one of the sidewalls, and a template for positioning aligned markings on the front side of the semiconductor wafer and the back side of the semiconductor wafer.

A semiconductor wafer is inserted into the at least one wafer-receiving slot. The semiconductor is then exposed utilizing the template to create aligned markings on the front side and back side of the semiconductor wafer. The markings are created in the same place on the front side and back side of the wafer. However, as long as the relative positions of the markings are known, the markings may be utilized for forming aligned structures on the front side and back side of the semiconductor wafer. The front side and back side of the semiconductor wafer may be exposed utilizing the template either separately or simultaneously. The wafer may then be further processed to develop the markings. Alignment detecting tools or marking detecting tools may than be utilized in further processing operations to create aligned structures on the front side and back side of the semiconductor wafer.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A device for creating at least one aligned marking on opposite sides of a semiconductor wafer including a front side and a back side, comprising:

a wafer receiving support unit including at least a first wafer receiving slot in a first side wall thereof for receiving a wafer inserted therein;

a template for positioning at least one aligned marking on each of the front side of the semiconductor wafer and on the backside of the semiconductor wafer;

a second wafer receiving slot provided in a second side wall of the wafer receiving support unit;

a third wafer receiving slot provided in a third side wall of the wafer receiving support unit; and a fourth wafer receiving slot provided in a fourth side wall of the wafer receiving support unit.

2. The device according to claim 1, further comprising:

at least one wafer support provided on an internal surface of the wafer receiving support unit for supporting the wafer upon insertion of the wafer through the wafer receiving slot and into the wafer receiving support unit.

3. The device according to claim 1, wherein the template includes patterns for forming a similar marking on a similar location on the front side and the back side of the semiconductor wafer.

4. A device, according to claim 1, wherein said template admits the passage of light to form an optical marking.

5. A device, according to claim 1, wherein said template is provided in at least one wafer receiving slot.

6. A device, according to claim 1, further comprising means to immobilize a semiconductor wafer.

7. A device, according to claim 2, comprising a plurality of semiconductor wafer supports.

8. A device, according to claim 1, wherein said wafer receiving slots do not support said semiconductor wafer.

9. A device, according to claim 1, wherein at least one of said wafer receiving slots has a width that can only partially accommodate the width of said semiconductor wafer therein.

10. A device, according to claim 1, wherein at least one said template is provided in each said wafer receiving slot.

* * * * *